(12) United States Patent
Matsumoto et al.

(10) Patent No.: US 10,586,323 B2
(45) Date of Patent: Mar. 10, 2020

(54) REFERENCE-IMAGE CONFIRMATION METHOD, MASK INSPECTION METHOD, AND MASK INSPECTION DEVICE

(71) Applicant: NUFLARE TECHNOLOGY, INC., Yokohama-shi (JP)

(72) Inventors: Eiji Matsumoto, Yokohama (JP); Manabu Isobe, Hiratsuka (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 124 days.

(21) Appl. No.: 15/723,948

(22) Filed: Oct. 3, 2017

(65) Prior Publication Data

US 2018/0101941 A1 Apr. 12, 2018

(30) Foreign Application Priority Data

Oct. 7, 2016 (JP) .................................. 2016-199435

(51) Int. Cl.
*G06T 7/00* (2017.01)
*G03F 1/84* (2012.01)
(Continued)

(52) U.S. Cl.
CPC ................ *G06T 7/001* (2013.01); *G03F 1/36* (2013.01); *G03F 1/84* (2013.01); *G06F 16/583* (2019.01);
(Continued)

(58) Field of Classification Search
CPC .................. G06T 7/001; G06T 7/0008; G06T 2207/30148; G06F 16/583; G03F 1/36; G03F 1/84
See application file for complete search history.

(56) References Cited

U.S. PATENT DOCUMENTS 9,727,980 B2    8/2017   Nakashima
10,026,011 B2   7/2018   Tsuchiya et al.
(Continued)

FOREIGN PATENT DOCUMENTS

JP    2015-145922    8/2015
JP    2016-21004     2/2016
(Continued)

OTHER PUBLICATIONS

Korean Office Action dated Mar. 12, 2019 in Korean Patent Application No. 10-2017-0117681 (with unedited computer generated English translation), 11 pages.

*Primary Examiner* — Carol Wang
(74) *Attorney, Agent, or Firm* — Oblon, McClelland, Maier & Neustadt, L.L.P.

(57) ABSTRACT

To include generating a reference image based on a comparison between design data of a mask having patterns and an optical image of the mask in a first region of the mask designated in advance, and confirming whether the generated reference image has effectiveness, the generating and the confirming being performed by a reference circuit, in which the confirmation on whether the reference image has effectiveness includes adding, as a confirmation region in which whether the reference image has effectiveness is to be confirmed, a second region of the mask in addition to the first region set in advance as the confirmation region, the adding being performed by an addition circuit, and confirming whether the reference image has effectiveness in the confirmation region including the first region and the second region, the confirming being performed by the reference circuit.

10 Claims, 6 Drawing Sheets

(51) Int. Cl.
   *G03F 1/36* (2012.01)
   *G06F 16/583* (2019.01)
(52) U.S. Cl.
   CPC .. *G06T 7/0008* (2013.01); *G06T 2207/30148* (2013.01)

(56) References Cited

U.S. PATENT DOCUMENTS

| | | | | |
|---|---|---|---|---|
| 2001/0055415 | A1* | 12/2001 | Nozaki | G01N 21/8851 382/141 |
| 2009/0238441 | A1* | 9/2009 | Yamashita | G06T 7/001 382/144 |
| 2010/0002930 | A1* | 1/2010 | Miyano | G01N 21/95607 382/144 |
| 2011/0091099 | A1* | 4/2011 | Akiyama | G03F 1/84 382/162 |
| 2012/0307043 | A1* | 12/2012 | Akiyama | G01N 21/95607 348/125 |
| 2014/0071228 | A1* | 3/2014 | Cho | H04N 5/23238 348/36 |
| 2014/0300893 | A1* | 10/2014 | Ogawa | G01N 21/9501 356/239.1 |
| 2014/0307254 | A1* | 10/2014 | Yamashita | G01N 21/95607 356/237.5 |
| 2014/0307945 | A1* | 10/2014 | Yasui | G06T 7/0008 382/149 |
| 2014/0320860 | A1* | 10/2014 | Taya | G01N 21/95607 356/437 |
| 2014/0348414 | A1* | 11/2014 | Hashimoto | G06T 7/001 382/144 |
| 2015/0279024 | A1* | 10/2015 | Tsuchiya | G03F 1/84 382/144 |
| 2015/0379707 | A1 | 12/2015 | Tsuchiya et al. | |
| 2016/0019689 | A1* | 1/2016 | Inoue | G06T 7/001 382/149 |
| 2016/0070971 | A1 | 3/2016 | Nakashima | |

FOREIGN PATENT DOCUMENTS

| | | |
|---|---|---|
| KR | 10-2016-0001665 A | 1/2016 |
| KR | 10-2016-0028954 A | 3/2016 |
| WO | WO 2006/073155 A1 | 7/2006 |

* cited by examiner

REFERENCE-IMAGE CONFIRMATION METHOD, MASK INSPECTION METHOD, AND MASK INSPECTION DEVICE

CROSS-REFERENCE TO RELATED APPLICATIONS

This application is based upon and claims the benefit of priority from Japanese Patent Application No. 2016-199435, filed on Oct. 7, 2016, the entire contents of which are incorporated herein by reference.

FIELD

The embodiments of the present invention relate to a reference-image confirmation method, a mask inspection method, and a mask inspection device monitoring.

BACKGROUND

An inspection device that inspects defects in a mask to be used for photolithography can perform a D-DB (Die to Database) inspection as one of inspection modes. In the D-DB inspection, an optical image of a mask optically detected by a sensor is compared with a reference image generated based on design data of the mask to inspect defects of a pattern formed on the mask.

There are cases where a pattern actually drawn on a mask does not strictly accord with a pattern on design data depending on characteristics of a charged particle beam used for drawing. For example, there is a case where a pattern is drawn with corners of the pattern on design data being rounded. Therefore, an optical image obtained by imaging an actual mask in the D-DB inspection may have a difference from the design data. However, this difference is not a difference caused by a defect of the pattern.

To prevent this difference from being detected as a false defect, a reference image is generated in the D-DB inspection by performing a filter calculation to design data (that is, image data) to approximate the design data to the optical image. In the filter calculation, a filter coefficient that designates a partial region in a mask and enables design data in the designated region to be approximated to an optical image in the designated region is settled. The filter calculation is then performed to the entire design data using the settled filter coefficient.

After the reference image is generated, whether the generated reference image has effectiveness for application to the D-DB inspection (hereinafter, also simply "effectiveness") is confirmed in the D-DB inspection. To confirm whether the reference image has effectiveness, the reference image is compared with the optical image only in the designated region for which the filter coefficient is settled. The reference image is determined to have effectiveness when a result of the comparison indicates that a difference between the reference image and the optical image is small, and the reference image is determined not to have effectiveness when the difference is large. The D-DB inspection using the reference image is performed when it is confirmed that the reference image has effectiveness, and the D-DB inspection using the reference image is not performed and the filter coefficient is resettled when it is confirmed that the reference image does not have effectiveness.

SUMMARY

However, whether the reference image has effectiveness is conventionally determined only in the designated region for which the filter coefficient is settled. Therefore, even when the difference between the reference image and the optical image becomes large in a region other than the designated region according to the design of the pattern in some cases, it is hard to detect the difference and resettle the filter coefficient.

When the D-DB inspection is performed using the reference image that has been confirmed to have the effectiveness only in the designated region, a false defect may be detected due to the difference between the reference image and the optical image being large in a region other than the designated region.

An object of the present invention is to provide a reference-image confirmation method, a mask inspection method, and a mask inspection device that enable to confirm whether a reference image has effectiveness with high accuracy and to suppress detection of a false defect.

A reference-image confirmation method according to an aspect of the present invention comprises: generating a reference image based on a comparison between design data of a mask having patterns and an optical image of the mask in a first region of the mask designated in advance, and confirming whether the generated reference image has effectiveness, the generating and the confirming being performed by a reference circuit, wherein the confirmation whether the reference image has effectiveness comprises: adding, as a confirmation region in which whether the reference image has effectiveness is to be confirmed, a second region of the mask in addition to the first region set in advance as the confirmation region, the adding being performed by an addition circuit; and confirming whether the reference image has effectiveness in the confirmation region comprising the first region and the second region, the confirming being performed by the reference circuit.

In the reference-image confirmation method described above, the second region may comprise a region peripheral to the first region.

In the reference-image confirmation method described above, the addition of the second region may be performed based on the design data.

In the reference-image confirmation method described above, the second region may comprise a region corresponding to a pattern group other than a pattern group corresponding to the first region among a plurality of pattern groups included in the design data.

In the reference-image confirmation method described above, the addition of the second region may be performed in accordance with a condition designated in advance.

In the reference-image confirmation method described above, the addition of the second region may be performed when the design data is collected into an inspection device inspecting defects in the mask.

In the reference-image confirmation method described above, the second region may comprise a region in which a false defect is detected during an inspection of defects in the mask.

In the reference-image confirmation method described above, the confirmation on whether the reference image has effectiveness may be performed based on a comparison between the reference image and the optical image in the confirmation region comprising the first region and the second region.

A mask inspection method according to another aspect of the present invention comprises: generating a reference image based on a comparison between design data of a mask having patterns and an optical image of the mask in a first region of the mask designated in advance, and confirming whether the generated reference image has effectiveness, the generating and the confirming being performed by a reference circuit; and inspecting defects in the mask based on the reference image confirmed to have effectiveness, the inspecting being performed by an inspection circuit, wherein the confirmation on whether the reference image has effectiveness comprises: adding, as a confirmation region in which whether the reference image has effectiveness is to be confirmed, a second region of the mask in addition to the first region set in advance as the confirmation region, the adding being performed by an addition circuit; and confirming whether the reference image has effectiveness in the confirmation region comprising the first region and the second region, the confirming being performed by the reference circuit.

A mask inspection device according to still another aspect of the present invention comprises: a reference circuit generating a reference image based on a comparison between design data of a mask having patterns and an optical image of the mask in a first region of the mask designated in advance, and confirming whether the generated reference image has effectiveness; an inspection circuit inspecting defects in the mask based on the reference image confirmed to have effectiveness; and an addition circuit adding, as a confirmation region in which whether the reference image has effectiveness is to be confirmed, a second region of the mask in addition to the first region set in advance as the confirmation region, wherein the reference circuit confirms whether the reference image has effectiveness in the confirmation region comprising the first region and the second region.

According to the present invention, it is possible to confirm whether a reference image has effectiveness with high accuracy and to suppress detection of a false defect.

DETAILED DESCRIPTION

Figure 1:
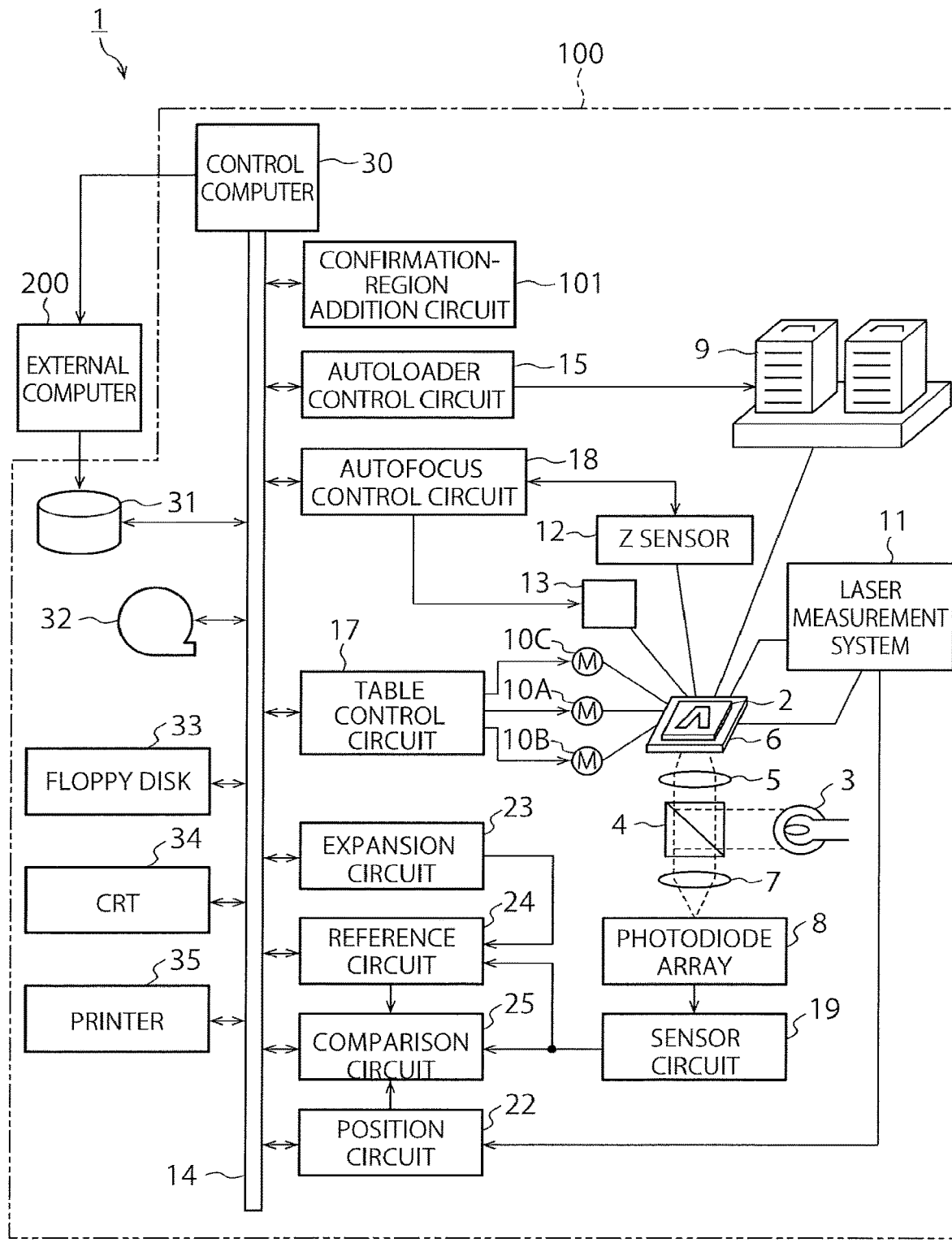
FIG. 1 illustrates a mask inspection system according to a first embodiment.

Embodiments of the present invention will now be explained with reference to the accompanying drawings. The present invention is not limited to the embodiments. In the drawings referred to in the following embodiments, like elements or elements having mutually identical functions are denoted by like or similar reference characters, and redundant explanations thereof will be omitted.

First Embodiment

FIG. 1 illustrates a mask inspection system 1 according to a first embodiment. The mask inspection system 1 illustrated in FIG. 1 can be used, for example, to inspect defects in a pattern formed on a mask 2 by a D-DB inspection.

As illustrated in FIG. 1, the mask inspection system 1 according to the first embodiment includes a mask inspection device 100 and an external computer 200.

The mask inspection device 100 includes a light source 3, a polarizing beam splitter 4, an illuminating optical system 5, an XYθ table 6, an enlarging optical system 7, and a photodiode array 8 in this order in a light travel direction. A waveplate that changes the polarization direction of light can be provided between the polarizing beam splitter 4 and the XYθ table 6.

The light source 3 emits laser light toward the polarizing beam splitter 4. The polarizing beam splitter 4 reflects the light from the light source 3 toward the illuminating optical system 5. The illuminating optical system 5 irradiates the XYθ table 6 with the light reflected by the polarizing beam splitter 4. The mask 2 placed on the XYθ table 6 reflects the light irradiated by the illuminating optical system 5. The mask 2 is illuminated with the reflection light of the mask 2. The reflection light of the mask 2 transmits through the illuminating optical system 5 and the polarizing beam splitter 4 and then enters the enlarging optical system 7. The enlarging optical system 7 causes the incident reflection light of the mask 2 to form an image on the photodiode array 8 as an image (hereinafter, also "optical image") of the mask 2. The photodiode array 8 photoelectrically converts the optical image of the mask 2. Defects in the pattern on the mask 2 are inspected based on the photoelectrically-converted optical image of the mask 2.

As illustrated in FIG. 1, the mask inspection device 100 also includes an autoloader 9, an X-axis motor 10A, a Y-axis motor 10B, a θ-axis motor 10C, a laser measurement system 11, a Z sensor 12, and a focus mechanism 13.

The autoloader 9 automatically transports the mask 2 on the XYθ table 6. The X-axis motor 10A, the Y-axis motor 10B, and the θ-axis motor 10C move the XYθ table 6 in an X direction, a Y direction, and a θ direction, respectively. This causes the mask 2 on the XYθ table 6 to be scanned with the light from the light source 3. The laser measurement system 11 detects positions of the XYθ table 6 in the X direction and the Y direction.

The Z sensor 12 detects the height of a mask face being a surface of the mask 2 on a pattern side, that is, the position in the Z direction. The Z sensor 12 can include, for example, a projector that applies light to the mask face, and a photoreceiver that receives the applied light.

The focus mechanism 13 performs focusing to bring the illuminating optical system 5 into focus on the mask face. The focusing is achieved, for example, by moving the XYθ table 6 in the Z direction by a movement amount corresponding to the height of the mask face detected by the Z sensor 12.

As illustrated in FIG. 1, the mask inspection device 100 further includes various circuits connected to a bus 14. Specifically, the mask inspection device 100 includes an autoloader control circuit 15, a table control circuit 17, and an autofocus control circuit 18. The mask inspection device 100 also includes a position circuit 22, an expansion circuit 23, a reference circuit 24, and a comparison circuit 25 being an example of an inspection circuit. The mask inspection device 100 also includes a sensor circuit 19 and the sensor circuit 19 is connected between the photodiode array 8, and the reference circuit 24 and the comparison circuit 25. The mask inspection device 100 further includes a confirmation-region addition circuit 101 being an example of an addition circuit.

The autoloader control circuit 15 controls the autoloader 9 to automatically transport the mask 2 on the XYθ table 6.

The table control circuit 17 drivingly controls the motors 10A to 10C to scan the mask 2 on the XYθ table 6 with the light from the light source 3.

The autofocus control circuit 18 controls the focus mechanism 13 according to the height of the mask face detected by the Z sensor 12 to automatically focus the light from the light source 3 on the mask face.

The sensor circuit 19 captures the optical image photoelectrically converted by the photodiode array 8 and A/D-converts the captured optical image. The sensor circuit 19 outputs the A/D-converted optical image to the reference circuit 24 and the comparison circuit 25. The sensor circuit 19 can be, for example, a circuit of a TDI (Time Delay Integration) sensor. With use of the TDI sensor, the pattern can be imaged with high accuracy.

The laser measurement system 11 detects a movement position of the XYθ table 6 and outputs the detected movement position to the position circuit 22. The position circuit 22 detects the position of the mask 2 on the XYθ table 6 based on the movement position input from the laser measurement system 11. The position circuit 22 outputs the detected position of the mask 2 to the comparison circuit 25.

The expansion circuit 23 reads design data collected from the external computer 200 into a magnetic disk device 31, which will be explained later, from the magnetic disk device 31.

The design data includes, for example, layout data indicating an arrangement state of chips being pattern groups on the design data, and chip data indicating frames and the like that constitute the chips. The positions of the chips and the like are specified in the layout data. The design data also has a chip address unit being a unit dimension of a chip for each of the chips. The design data also has a scale ratio for each of the chips. The scale ratio is, for example, a diminution ratio of a chip used when the chip is drawn on a mask blank in a shrunk state in a manufacturing process of the mask 2.

The expansion circuit 23 converts the design data read from the magnetic disk device 31 into binary or multi-valued image data based on the address unit and the scale ratio. The expansion circuit 23 outputs the design data converted into the image data to the reference circuit 24.

In the present specification, the design data converted into the image data is also referred to as "design data" without being referred to as "image data".

The reference circuit 24 generates a reference image to be used for a defect inspection on the mask 2 based on a comparison between the design data of the mask 2 and the optical image thereof in a first region (that is, coordinates) of the mask 2, designated in advance by an input operation of a user.

Specifically, the reference circuit 24 compares the design data of the mask 2 input from the expansion circuit 23 and the optical image of the mask 2 input from the sensor circuit 19 with each other in the first region, and settles a filter coefficient that can approximate the design data in the first region to the optical image in the first region. The settling of a filter coefficient is also referred to as "learning of a reference image".

A specific mode of the filter coefficient is not particularly limited and can be, for example, a value specifying a feathering amount or a rounding amount to be applied to the design data in the filter calculation.

The reference circuit 24 generates a reference image by performing a filter calculation on the entire design data using the settled filter coefficient.

After generating the reference image, the reference circuit confirms whether the generated reference image has effectiveness while regarding the first region having been used to generate the reference image, that is, to settle the filter coefficient as a confirmation region in which whether the reference image has effectiveness is to be confirmed. The first region is set in advance as the confirmation region. The first region can be set as the confirmation region in a storage region of the reference circuit 24 or can be set as the confirmation region in a storage unit of the mask inspection device 100, other than the storage region of the reference circuit 24, in a state readable by the reference circuit 24. The first region can be set as the confirmation region by the reference circuit 24 or a constituent unit of the mask inspection device 100 other than the reference circuit 24 according to the input operation of the user for designating the first region as described above.

When whether the reference image has effectiveness is to be confirmed, the confirmation-region addition circuit 101 automatically adds a second region in the mask 2 as the confirmation region, as well as the first region set in advance as the confirmation region. Addition of the second region can be achieved, for example, by notifying the reference circuit 24 of information of the second region or recording the information of the second region in the storage unit of the mask inspection device 100 in a state readable by the reference circuit 24.

The second region can be a region peripheral to the first region. In this case, the peripheral region of the first region can be a region located at a position away from the first region by a distance being an integral multiple of the dimension of the first region. For example, when the first region is a region including 1024 pixels (the X axis)×1024 pixels (the Y axis), the peripheral region of the first region can be a region located at a position away from the first region by 2048 pixels in the X-axis direction or a region located at a position away from the first region by 2048 pixels in the Y-axis direction.

The confirmation-region addition circuit 101 can alternatively add the second region based on the design data. In this case, the second region can be a region corresponding to a chip other than a chip corresponding to the first region among a plurality of chips (that is, pattern groups) included in the design data. In other words, the second region can be a region on a chip other than the chip to which the first region is designated.

The confirmation-region addition circuit 101 can perform addition of the second region based on the described design data in accordance with a condition defaulted or designated in advance by an input operation of the user. For example, the condition designated in advance can be adding central coordinates of a chip other than the chip corresponding to the first region as the second region or can be a line width of a pattern in the second region. The confirmation-region addition circuit 101 can detect the second region according to the condition designated in advance using a layout analyzer, and add the detected second region to the confirmation region.

When the second region is added to the confirmation region, the reference circuit 24 confirms whether the reference image has effectiveness in the confirmation region including both the first region and the second region. The effectiveness of the reference image is also validity of the result (the reference image) of the filter calculation on the entire design data using the filter coefficient.

Specifically, the reference circuit 24 compares the reference image generated by the reference circuit 24 and the optical image of the mask 2 with each other in both the first region and the second region. When a difference between the reference image and the optical image is small in both the first region and the second region as a result of the comparison, the reference circuit 24 determines that the reference image has effectiveness. On the other hand, when a difference between the reference image and the optical image is large in at least either the first region or the second region, the reference circuit 24 determines that the reference image does not have effectiveness.

The reference circuit 24 can determine that the reference image has effectiveness when a difference in pixel values between the reference image and the optical image is below a threshold value in both the first region and the second region.

When it is confirmed that the reference image has effectiveness, the reference circuit 24 outputs the reference image to the comparison circuit 25. On the other hand, when it is confirmed that the reference image does not have effectiveness, the reference circuit 24 does not output the reference image to the comparison circuit 25 and resettles the filter coefficient.

With this confirmation on whether the reference image has effectiveness in both the first region for which the filter coefficient has been settled and the second region automatically added by the confirmation-region addition circuit 101, the presence in the second region of a pattern greatly different from a pattern in the first region in the line width or the shape can be detected based on a confirmation result that the reference image does not have effectiveness. A chance to resettle the filter coefficient so as to obtain a reference image having effectiveness in both the first region and the second region can be provided. This enables to confirm whether the reference image has effectiveness with high accuracy and therefore can suppress detection of a false defect.

The comparison circuit 25 performs a defect inspection based on the optical image of the mask 2 and the reference image. Specifically, the comparison circuit 25 measures line widths in the pattern of the optical image at respective positions using the position information input from the position circuit 22. The comparison circuit 25 compares line widths or tone values, that is, brightness levels between the measured pattern of the optical image and a pattern of the reference image input from the reference circuit 24. The comparison circuit 25 then detects an error between the line width of the pattern of the optical image and the line width of the pattern of the reference image, for example, as a defect of the pattern.

As illustrated in FIG. 1, the mask inspection system 1 also includes a control computer 30, the magnetic disk device 31, a magnetic tape device 32, a floppy Disk® 33, a CRT (Cathode Ray Tube) 34, and a printer 35. These constituent units 30 to 35 are all connected to the bus 14. The control computer 30 executes various types of control or processing related to the defect inspection to the constituent units connected to the bus 14. For example, the control computer 30 executes control on the external computer 200 to collect the design data into the magnetic disk device 31. The magnetic disk device 31 stores therein the data collected from the external computer 200. The magnetic tape device 32 and the floppy disk 33 store therein various types of information related to the defect inspection. The CRT 34 displays various images related to the defect inspection. The printer 35 prints various types of information related to the defect inspection.

The external computer 200 is provided outside the mask inspection device 100. The external computer 200 retains the design data in a storage device thereof. The external computer 200 transmits the design data to the magnetic disk device 31 through a collection path. The external computer 200 is a device outside the mask inspection device 100. Accordingly, the external computer 200 can transmit the design data to the magnetic disk device 31 independently from processing of the mask inspection device 100. That is, the external computer 200 enables the design data to be collected into the magnetic disk device 31 with hardly applying processing load onto the control computer 30. Therefore, the processing by the control computer 30 can be achieved quickly and thus the defect inspection can be speeded up.

As described above, with the mask inspection device 100 according to the first embodiment, whether the reference image has effectiveness in both the first region in which the reference image has been learned and the second region automatically added by the confirmation-region addition circuit 101 can be confirmed with high accuracy. As a result, detection of a false defect can be suppressed and the detection accuracy can be enhanced.

(Mask Inspection Method)

Figure 2:
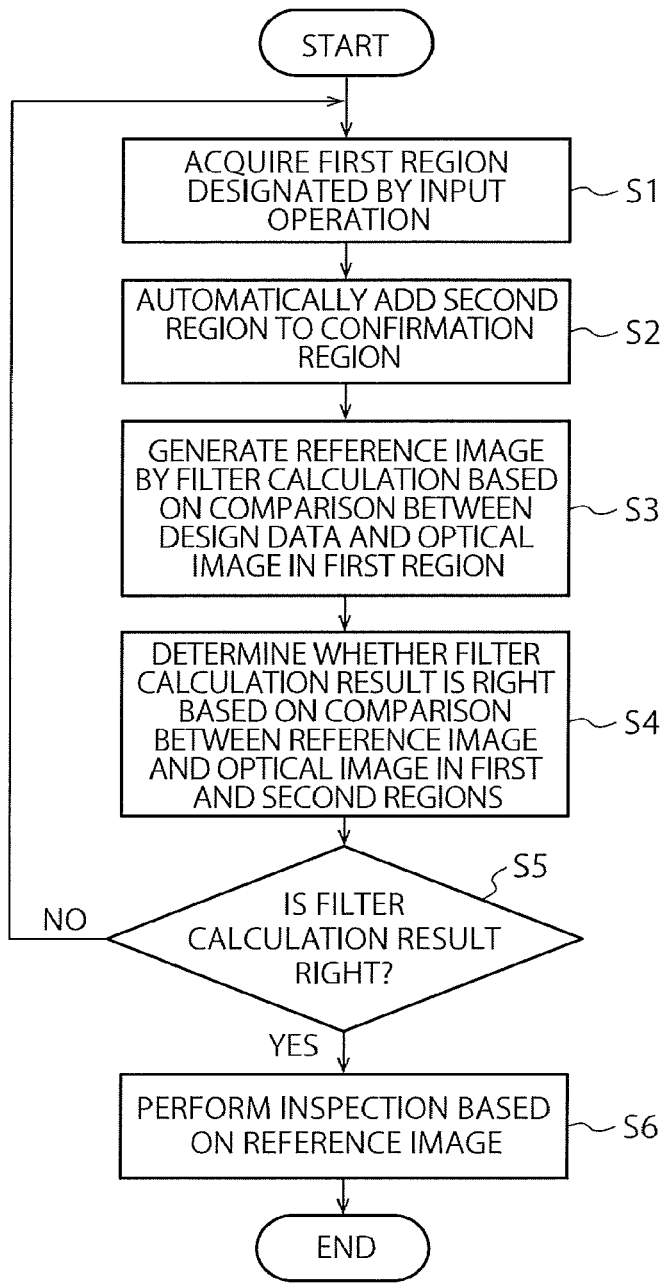
FIG. 2 is a flowchart illustrating a mask inspection method according to the first embodiment.
Figure 3:
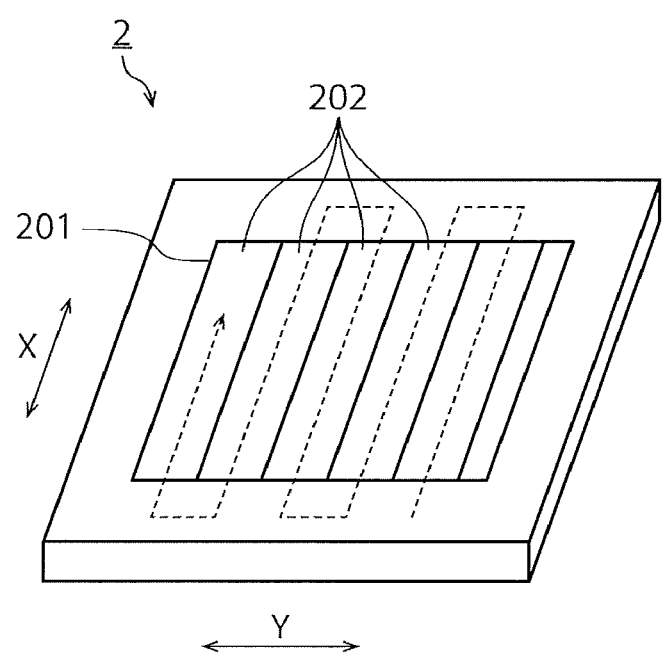
FIG. 3 is a perspective view illustrating the mask inspection method according to the first embodiment.

A mask inspection method according to the first embodiment, to which the mask inspection system 1 illustrated in FIG. 1 is applied, is explained next. FIG. 2 is a flowchart illustrating the mask inspection method according to the first embodiment. FIG. 3 is a perspective view illustrating the mask inspection method according to the first embodiment. In the mask inspection method according to the first embodiment, the XYθ table 6 is moved in such a manner that stripes 202 in an inspection region 201 are scanned continuously in a direction indicated by a dashed arrow in FIG. 3. While the XYθ table 6 is moved, defects in a pattern on the stripes 202 are inspected based on an optical image obtained by the photodiode array 8. Confirmation on whether a reference image has effectiveness during the defect inspection on the pattern is mainly explained below.

First, as illustrated in FIG. 2, the reference circuit 24 and the confirmation-region addition circuit 101 acquire a first region of the mask 2, designated by an input operation (Step S1). The reference circuit 24 sets the acquired first region as both a region to be used for settling a filter coefficient, that is, for generating a reference image, and a confirmation region to be used for confirming whether the reference image has effectiveness.

After acquiring the first region, the confirmation-region addition circuit 101 automatically adds a second region, as well as the first region set in advance as the confirmation region, as the confirmation region in accordance with a condition defaulted or designated in advance by an input operation of a user (Step S2).

After adding the second region, the reference circuit 24 settles the filter coefficient that can approximate the design data of the first region to an optical image of the first region based on a comparison between the design data of the mask 2 and an optical image thereof in the first region. The reference circuit 24 then generates a reference image by performing a filter calculation on the entire design data using the settled filter coefficient. That is, the reference circuit 24 generates the reference image by the filter calculation based on the comparison between the design data and the optical image in the first region (Step S3).

After generating the reference image, the reference circuit 24 compares the reference image and the optical image with each other in the first region and the second region and determines whether the reference image has effectiveness based on whether a difference between the reference image and the optical image is below a threshold value in both the first region and the second region. That is, the reference circuit 24 determines whether the filter calculation result (the reference image) is right based on the comparison between the reference image and the optical image in the first and second regions (Step S4).

When the filter calculation result is right (YES at Step S5), that is, when it is confirmed that the reference image has effectiveness, the comparison circuit 25 performs a defect inspection based on the reference image (Step S6). On the other hand, when the filter calculation result is not right (NO at Step S5), that is, when it is not confirmed that the reference image has effectiveness, the comparison circuit 25 does not perform the defect inspection based on the reference image. In this case, processes after Step S1 are repeated to resettle the filter coefficient.

When the filter coefficient is to be resettled, the reference circuit 24 can resettle the filter coefficient by modifying the filter coefficient with a predetermined modification amount. Alternatively, the reference circuit 24 can add the second region to the first region as a region for which the filter coefficient is to be settled and can resettle the filter coefficient based on a comparison between the design data and the optical image in the first region and the second region.

If whether the reference image has effectiveness is confirmed using only the first region for which the filter coefficient has been settled as the confirmation region and when the difference between the reference image and the optical image in the first region is small, it is determined that the reference image has effectiveness even in a case where the second region includes a pattern in which the difference between the reference image and the optical image becomes large. In this case, even if the pattern in the second region does not have a defect, the difference between the reference image and the optical image in the second region becomes large and this difference is detected as a false defect during the defect inspection.

In contrast thereto, according to the first embodiment, whether the reference image has effectiveness is confirmed using also the second region as well as the first region as the confirmation region. Accordingly, when the difference between the reference image and the optical image becomes large because the pattern in the second region is different from that in the first region, this can be detected at a stage of confirming whether the reference image has effectiveness, and the filter coefficient can be resettled to reduce the difference. A reference image having effectiveness in both the first region and the second region can then be acquired by the filter calculation using the resettled filter coefficient. To the reference image having effectiveness in both the first region and the second region, feathering or rounding for approximating to the optical image is appropriately performed also in the second region as well as in the first region. By performing a defect inspection using this reference image, occurrence of a difference between the reference image and the optical image other than actual defects can be suppressed and thus detection of a false defect can be suppressed effectively.

Therefore, according to the first embodiment, automatic addition of the second region other than the first region as the confirmation region enables to confirm whether the reference image has effectiveness with high accuracy in both the first region and the second region. As a result, detection of a false defect can be suppressed.

When a peripheral region away from the first region by a predetermined distance is added as the second region, there is a possibility that a pattern in the peripheral region is different from a pattern in the first region and thus determination accuracy of effectiveness of the reference image can be enhanced.

When a region corresponding to a chip other than a chip corresponding to the first region is added as the second region, a second region suitable for confirming whether the reference image has effectiveness with high accuracy can be set in considering that the shapes or dimensions of patterns may differ according to the chips.

Furthermore, when the second region is added in accordance with a condition designated by a user, whether the reference image conforming to desires of the user has effectiveness can be confirmed.

Second Embodiment

Figure 4:
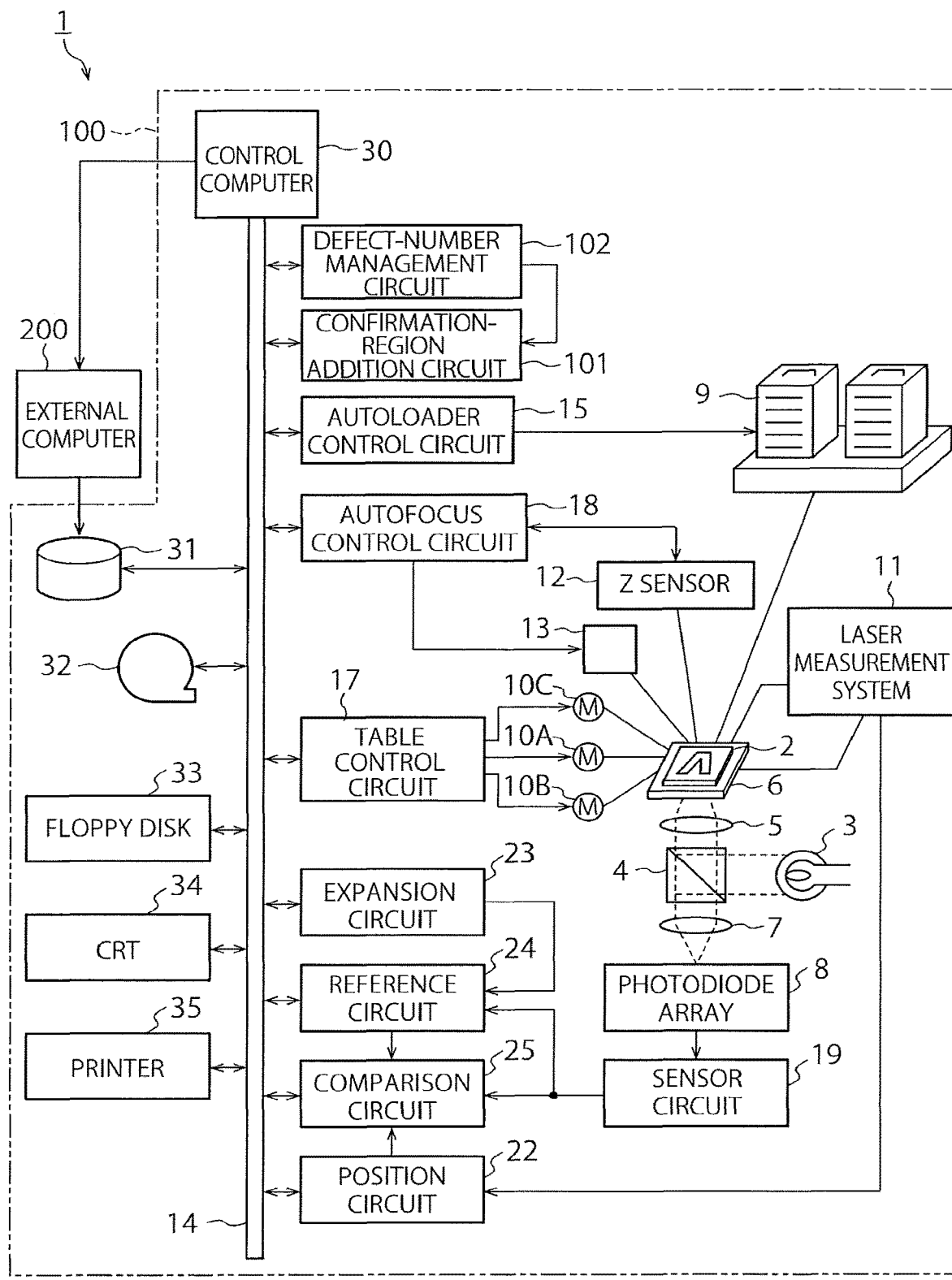
FIG. 4 illustrates a mask inspection system according to a second embodiment.

A second embodiment in which a region where a false defect has been detected during a defect inspection on the mask 2 is added as the second region is explained next. FIG. 4 illustrates a mask inspection system 1 according to the second embodiment.

As illustrated in FIG. 4, the mask inspection system 1 according to the second embodiment further includes a defect-number management circuit 102 in the mask inspection device 100 in addition to the configuration of the first embodiment.

The defect-number management circuit 102 manages the number of defects detected by the comparison circuit 25 in the mask 2 with respect to each of the stripes 202 during a defect inspection for each of the stripes 202 by the comparison circuit 25. When the number of defects in each of the stripes 202 becomes equal to or larger than an allowable value, the defect-number management circuit 102 determines that a false defect occurs in the relevant stripe 202 and notifies the confirmation-region addition circuit 101 of the relevant stripe 202.

The confirmation-region addition circuit 101 automatically adds a representative point of the stripe 202 notified by the defect-number management circuit 102 as the second region to the confirmation region. The representative point of the stripe 202 can be coordinates of the center of gravity of the stripe 202 although not limited thereto. The representative point of the stripe 202 is not limited to one point, and two or more points can be used. The representative point of the stripe 202 can be a region having an extent.

When the second region is automatically added by the confirmation-region addition circuit 101, the reference circuit 24 confirms whether the reference image has effectiveness in both the added second region and the first region already set. When it is confirmed that the reference image does not have effectiveness, the reference circuit 24 resettles the filter coefficient and regenerates a reference image by a filter calculation using the resettled filter coefficient. The comparison circuit 25 performs the inspection again using the reference image regenerated by the reference circuit 24.

Figure 5:
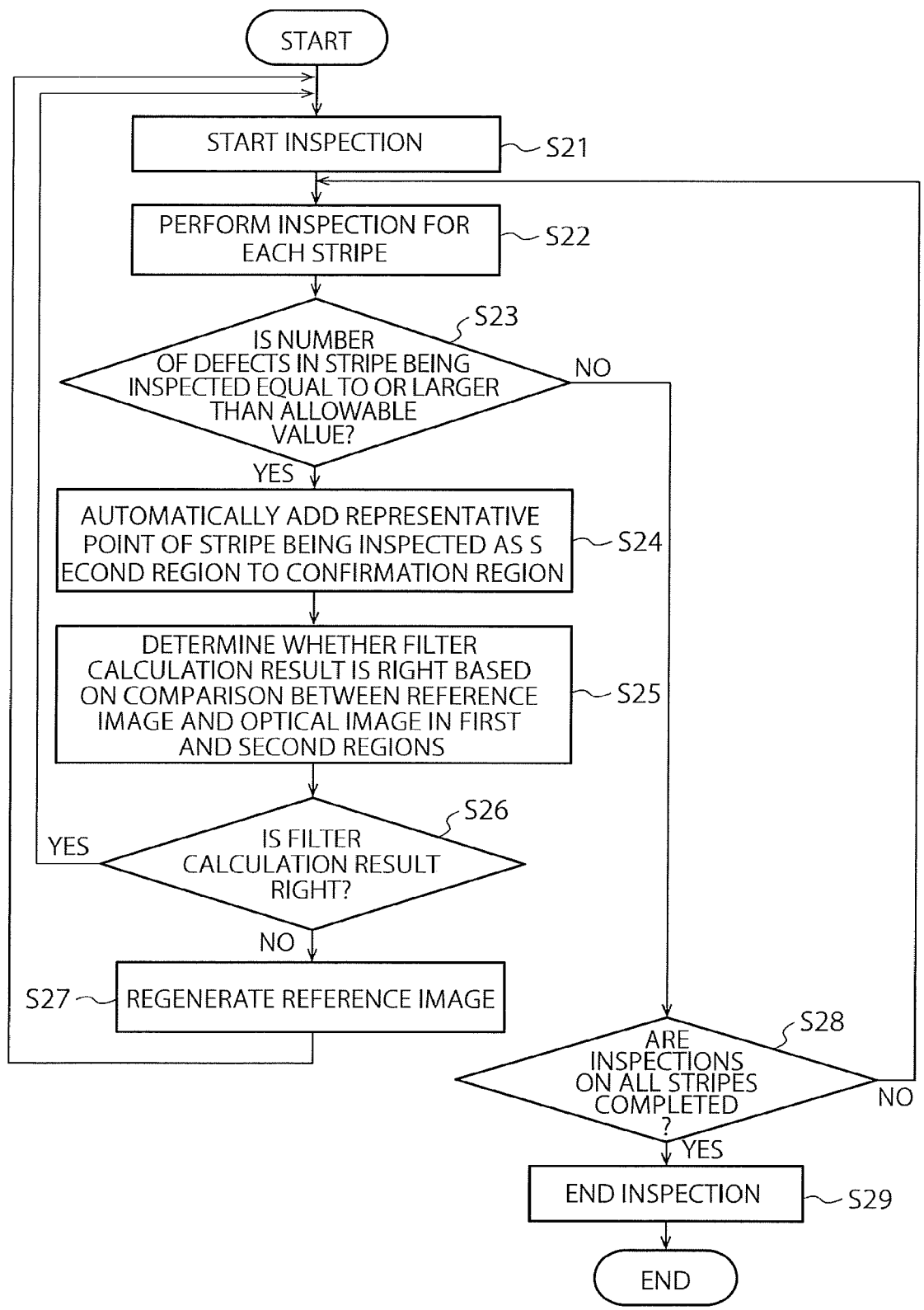
FIG. 5 is a flowchart illustrating a mask inspection method according to the second embodiment.

FIG. 5 is a flowchart illustrating a mask inspection method according to the second embodiment. First, as illustrated in FIG. 5, the comparison circuit 25 starts a defect inspection based on a reference image for the mask 2 (Step S21).

The inspection is started after performing processing at a previous stage, such as an inspection setup and a pre-inspection preparation. In the inspection setup, loading of the mask 2, alignment of the mask 2, calibration of an imaging condition (a light intensity, for example) depending on the mask 2, and setting of the inspection region 201 are performed in this order. The inspection setup includes also generation of a reference image by the reference circuit 24, confirmation on whether the reference image has effectiveness, and regeneration of a reference image according to a result of the confirmation on whether the reference image has effectiveness. In the pre-inspection preparation, a calculation of virtually dividing the inspection region 201 into a plurality of stripes 202 is performed.

Upon start of the inspection, the comparison circuit 25 performs a defect inspection on the mask 2 for each of the stripes 202 in turns (Step S22).

In the course of the defect inspection for each of the stripes 202, the defect-number management circuit 102 determines whether the number of defects in a stripe 202 being inspected is equal to or larger than an allowable value (Step S23).

When the number of defects in the stripe 202 being inspected is equal to or larger than the allowable value (YES at Step S23), the defect-number management circuit 102 notifies the confirmation-region addition circuit 101 of the stripe 202 being inspected. The confirmation-region addition circuit 101 automatically adds a representative point of the notified stripe 202 as the second region to the confirmation region (Step S24).

After adding the second region, the reference circuit 24 compares the reference image and the optical image in both the first region and the second region and determines whether a result of the filter calculation used to generate the reference image is right (Step S25). That is, the reference circuit 24 confirms whether the reference image has effectiveness.

When the filter calculation result is right (YES at Step S26), that is, when the reference image has effectiveness, the comparison circuit 25 resumes a defect inspection based on the current reference image (Step S21).

On the other hand, when the filter calculation result is not right (NO at Step S26), that is, when the reference image does not have effectiveness, the reference circuit 24 resettles the filter coefficient by a predetermined method and regenerates the reference image using the resettled filter coefficient (Step S27). The comparison circuit 25 then starts a defect inspection based on the regenerated reference image (Step S21).

When the number of defects in a stripe 202 being inspected is not equal to or larger than the allowable value (NO at Step S23), the comparison circuit 25 determines whether inspections on all the stripes 202 are completed (Step S28).

When the inspections on all the stripes 202 are completed (YES at Step S28), the comparison circuit 25 ends the inspection (Step S29). When the inspections on all the stripes 202 are not completed (NO at Step S28), the comparison circuit 25 continues the inspection for each of the stripes 202 (Step S22).

In a stripe 202 having so many defects, many false defects may occur because the pattern of the relevant stripe 202 is different from that of the first region. According to the second embodiment, a representative point of a stripe 202 having defects equal to or more than the allowable value is automatically added to the confirmation region, so that a pattern different from the pattern of the first region can be securely detected not to have effectiveness as a confirmation result. The reference image is then regenerated according to the confirmation result that there is no effectiveness, and the inspection is performed again based on the regenerated reference image, whereby redetection of the false defects can be suppressed.

Third Embodiment

Figure 6:
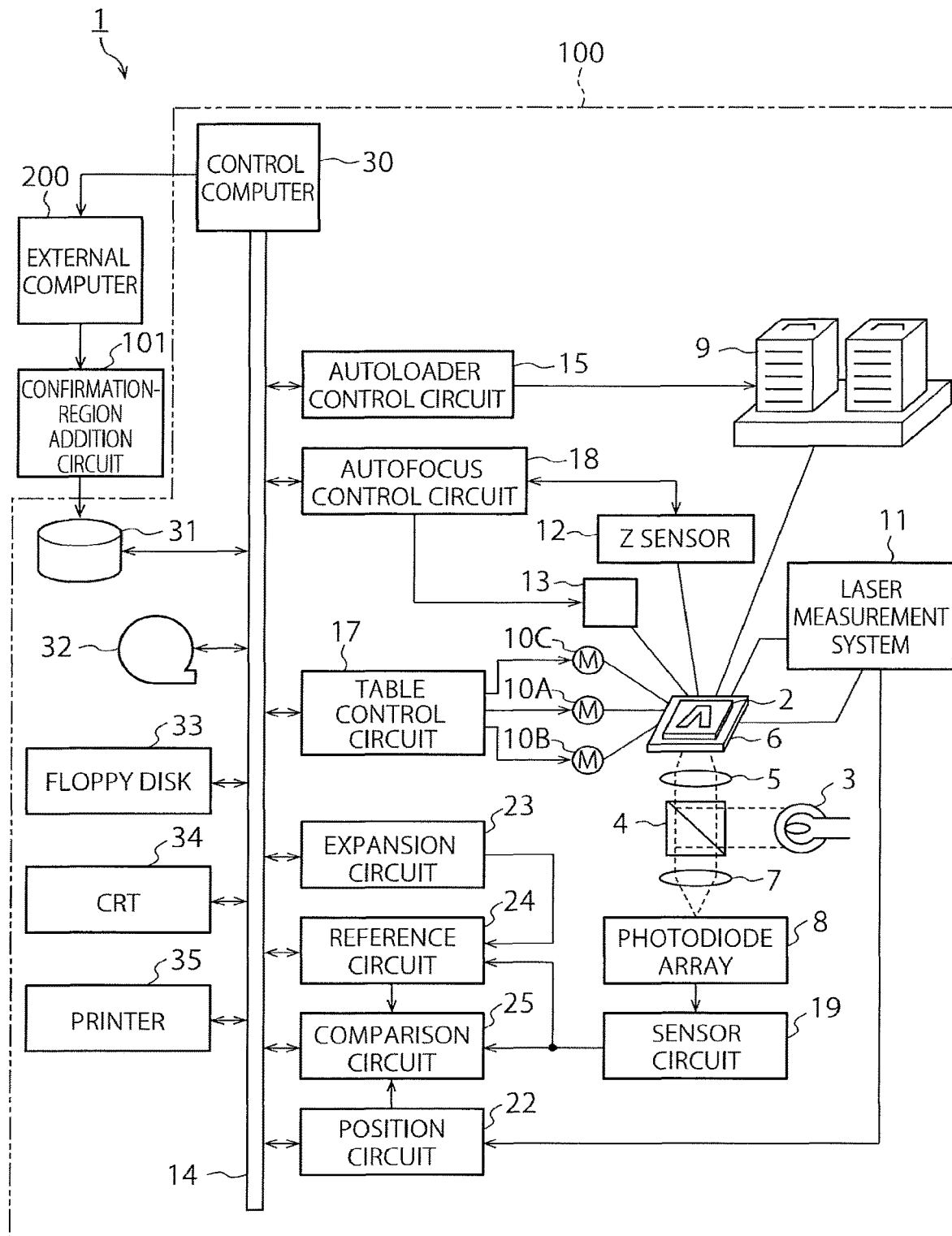
FIG. 6 illustrates a mask inspection system according to a third embodiment.

A third embodiment in which a second region is added when design data is collected into the mask inspection device 100 is explained next. FIG. 6 illustrates a mask inspection system according to the third embodiment.

As illustrated in FIG. 6, in the mask inspection system 1 according to the third embodiment, the confirmation-region addition circuit 101 is placed on a collection path between the external computer 200 and the magnetic disk device 31. The confirmation-region addition circuit 101 adds the second region based on the design data at the time of collection of the design data before start of an inspection. At the time of collection of the design data, the first region is already designated.

The second region added based on the design data can be, for example, a region on a chip (coordinates of the center of gravity of the chip, for example) different from a chip to which the first region is designated among the chips of the mask 2, as described above.

According to the third embodiment, the second region is added to the confirmation region before start of an inspection and accordingly load of the control computer 30 can be reduced relative to a case where the second region is added during an inspection.

The third embodiment can be combined with the first or second embodiment.

At least a part of the mask inspection system 1 can be constituted by hardware or software. When it is constituted by software, it is possible to configure that a program realizing at least a part of the functions of the mask inspection system 1 is stored in a recording medium such as a flexible disk or a CD-ROM and a computer is caused to read and execute the program. The recording medium is not limited to a detachable medium such as a magnetic disk or an optical disk, and can be an anchored recording medium such as a hard disk device or a memory.

The embodiments described above have been presented by way of example only and is not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

The invention claimed is:

1. A reference-image confirmation method comprising:
generating a reference image based on a comparison between design data of a mask having patterns and an optical image of the mask in a first region of the mask designated in advance, and confirming whether the generated reference image has effectiveness, the generating and the confirming being performed by a reference circuit before an inspection of defects in the mask, wherein
the confirmation whether the reference image has effectiveness comprises:
adding, as a confirmation region in which whether the reference image has effectiveness is to be confirmed, a second region of the mask in addition to the first region set in advance as the confirmation region, the adding being performed by an addition circuit; and
confirming whether the reference image has effectiveness in the confirmation region comprising the first region and the second region, the confirming being performed by the reference circuit.

2. The method of claim 1, wherein the second region comprises a region peripheral to the first region.

3. The method of claim 1, wherein the addition of the second region is performed based on the design data.

4. The method of claim 3, wherein the second region comprises a region corresponding to a pattern group other than a pattern group corresponding to the first region among a plurality of pattern groups included in the design data.

5. The method of claim 4, wherein the addition of the second region is performed in accordance with a condition designated in advance.

6. The method of claim 3, wherein the addition of the second region is performed when the design data is collected into an inspection device inspecting defects in the mask.

7. The method of claim 1, wherein the confirmation on whether the reference image has effectiveness is performed based on a comparison between the reference image and the optical image in the confirmation region comprising the first region and the second region.

8. The method of claim 1, wherein the first region is a region designated in advance by an input operation of a user.

9. A mask inspection method comprising:
generating a reference image based on a comparison between design data of a mask having patterns and an optical image of the mask in a first region of the mask designated in advance, and confirming whether the generated reference image has effectiveness, the generating and the confirming being performed by a reference circuit before an inspection of defects in the mask; and
inspecting the defects in the mask based on the reference image confirmed to have effectiveness, the inspecting being performed by an inspection circuit, wherein
the confirmation on whether the reference image has effectiveness comprises:
adding, as a confirmation region in which whether the reference image has effectiveness is to be confirmed, a second region of the mask in addition to the first region set in advance as the confirmation region, the adding being performed by an addition circuit; and
confirming whether the reference image has effectiveness in the confirmation region comprising the first region and the second region, the confirming being performed by the reference circuit.

10. A mask inspection device comprising:
a reference circuit generating a reference image based on a comparison between design data of a mask having patterns and an optical image of the mask in a first region of the mask designated in advance, and confirming whether the generated reference image has effectiveness before an inspection of defects in the mask;
an inspection circuit inspecting the defects in the mask based on the reference image confirmed to have effectiveness; and
an addition circuit adding, as a confirmation region in which whether the reference image has effectiveness is to be confirmed, a second region of the mask in addition to the first region set in advance as the confirmation region, wherein
the reference circuit confirms whether the reference image has effectiveness in the confirmation region comprising the first region and the second region.

* * * * *